United States Patent
Huang et al.

(10) Patent No.: US 7,179,759 B2
(45) Date of Patent: Feb. 20, 2007

(54) BARRIER LAYER AND FABRICATION METHOD THEREOF

(75) Inventors: Cheng-Lin Huang, Hsinchu (TW); Ching-Hua Hsieh, Hsinchu (TW); Shau-Lin Shue, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/955,519

(22) Filed: Sep. 30, 2004

(65) Prior Publication Data

US 2006/0068604 A1    Mar. 30, 2006

(51) Int. Cl.
  *H01L 21/31* (2006.01)
  *H01L 21/469* (2006.01)

(52) U.S. Cl. .............................. 438/785; 257/E21.584; 438/643

(58) Field of Classification Search ................ 438/785, 438/685, 643; 257/E21.584
See application file for complete search history.

(56) References Cited

U.S. PATENT DOCUMENTS

| | | | |
|---|---|---|---|
| 5,919,531 A * | 7/1999 | Arkles et al. | 427/576 |
| 6,269,144 B1 * | 7/2001 | Dube et al. | 378/71 |
| 6,402,907 B1 | 6/2002 | Rich | |
| 6,498,091 B1 | 12/2002 | Chen et al. | |
| 6,787,481 B2 * | 9/2004 | Asai et al. | 438/785 |
| 2001/0055875 A1 | 12/2001 | Sandhu et al. | |
| 2003/0042133 A1 | 3/2003 | Lee et al. | |
| 2003/0190813 A1 | 10/2003 | Huang et al. | |
| 2004/0129671 A1 * | 7/2004 | Ji et al. | 216/58 |

* cited by examiner

*Primary Examiner*—Caridad Everhart
(74) *Attorney, Agent, or Firm*—Duane Morris LLP

(57) ABSTRACT

A barrier layer and a fabrication thereof are disclosed. The barrier layer comprises at least one barrier material selected from the group consisting of Ta, W, Ti, Ru, Zr, Hf, V, Nb, Cr and Mo and at least one component of oxygen, nitrogen or carbon. A ratio of the component to the barrier material is not less than about 0.45. The fabrication method of the barrier layer applies a working pressure for forming the barrier layer from about 0.5 mTorr to about 200 mTorr substantially without forming crystalline material therein.

23 Claims, 4 Drawing Sheets

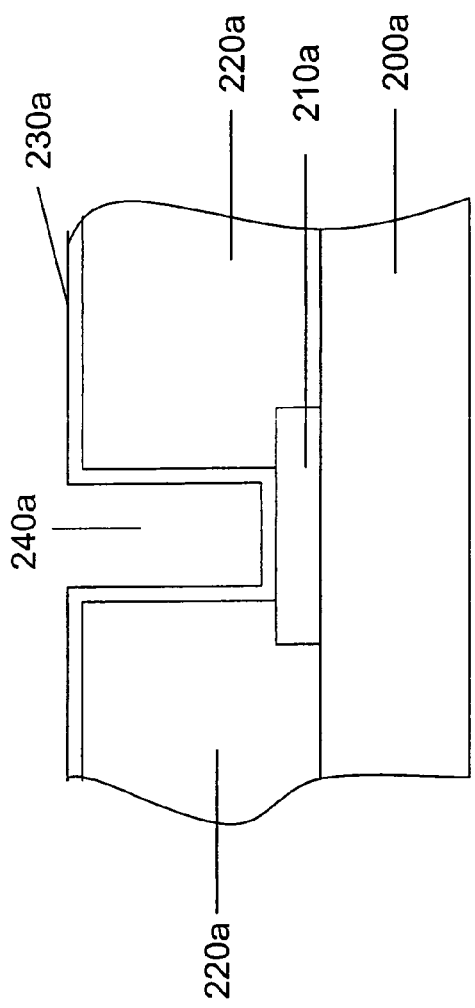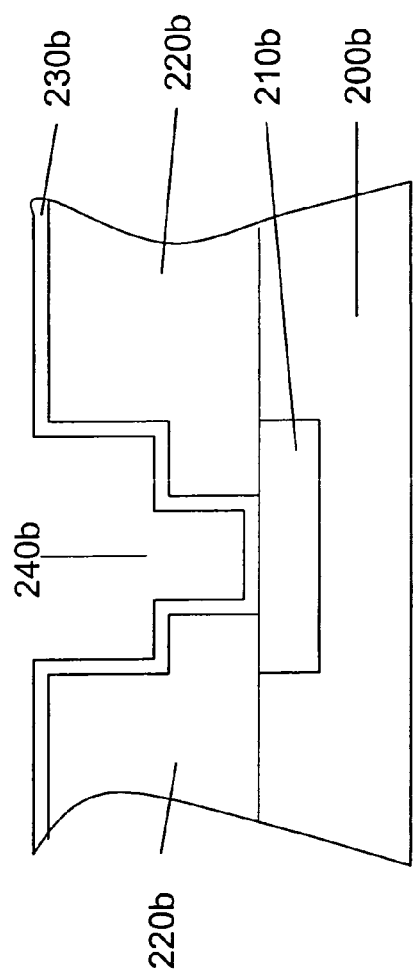
FIG. 2A
FIG. 2B

BARRIER LAYER AND FABRICATION METHOD THEREOF

BACKGROUND OF THE INVENTION

1. Field of the Invention

The present invention relates to a film layer and a method for semiconductor devices; more particularly, to a barrier layer and a fabrication method thereof.

2. Description of the Related Art

Complementary Metal Oxide Semiconductor (CMOS) technology has been frequently applied in manufacturing integrated circuits (IC). With the advance of CMOS technology, the miniaturization of CMOS devices according to a scaling rule is used in a semiconductor device to achieve large-scale integration and high-speed operation. In addition to the miniaturization of the scale of the CMOS devices, multiple-level interconnect technology is also applied to increase the high density of integration.

In multiple-level interconnect technology, a barrier layer usually is formed in a via or contact hole before deposition of a metal layer. The conformity of the barrier layer affects the subsequent deposition of the metal layer. In a worse case, a non-conformal barrier layer results in an overhead issue at the top of the via or contact hole. The overheads may cause a pin hole in the via or contact hole so that the metal layer cannot fill therein. The overhead issue becomes worse when the scale of the contact or via hole shrinks. Accordingly, the formation of a conformal barrier layer in a miniaturized via or contact hole is critical in semiconductor manufacturing.

U.S. Pat. No. 6,402,907 shows a method of forming a barrier layer in a high aspect ratio recess in a dielectric layer on a semiconductor wafer. The method includes two main steps: (a) sputtering, at a pressure of 1 mTorr or less, a titanium layer onto an exposed surface of the recesses with the dielectric layer at a first distance from a sputter source or target; and (b) sputtering at a pressure in the range 1 millitorr to 0.5 millitorr a stochiometric titanium nitride layer onto the titanium layer with the dielectric at a second shorter distance from the sputter source or target.

U.S. Patent Publication No. 2003/0042133 shows a method for forming a barrier layer in a via or contact hole. The method first applies a first pressure in the chamber during an increase in pressure which is different from a second pressure in the chamber during a decrease in pressure, while an equal amount of the nitrogen gas is provided into the sputter chamber. Accelerated particles collide with the target to sputter the metal material from the target.

SUMMARY OF THE INVENTION

A method for forming a barrier layer is provided. The method comprises applying a working pressure for forming the barrier layer from about 0.5 mTorr to about 200 mTorr without substantially forming crystalline material therein.

A barrier layer is also disclosed. The barrier layer is formed by the method described above.

The barrier layer comprises a compound made from barrier material selected from a group consisting Ta, W, Ti, Ru, Zr, Hf, V, Nb, Cr and Mo and at least one reaction gas containing at least one component of oxygen, nitrogen or carbon; a flow rate of the reaction gas from about 5 standard cubic centimeters per minute (sccm) to about 200 sccm; an argon gas with a flow rate from about 5 sccm to about 200 sccm; a target DC power from about 10,000 Watts to about 90,000 Watts; and a wafer bias power from about 100 Watts to about 1,500 Watts. A ratio of the component to the barrier material not less than about 0.45.

In a particularly preferred embodiment, the barrier layer comprises a N/Ta ratio from about 0.45 to about 1.00.

The above and other features of the present invention will be better understood from the following detailed description of the preferred embodiments of the invention that is provided in connection with the accompanying drawings.

BRIEF DESCRIPTION OF THE DRAWINGS

FIGS. 2A and 2B are schematic cross sectional drawings showing exemplary barrier layers depositing in a via hole and in a via hole/trench structure, respectively.

DESCRIPTION OF THE PREFERRED EMBODIMENT

Figure 1:
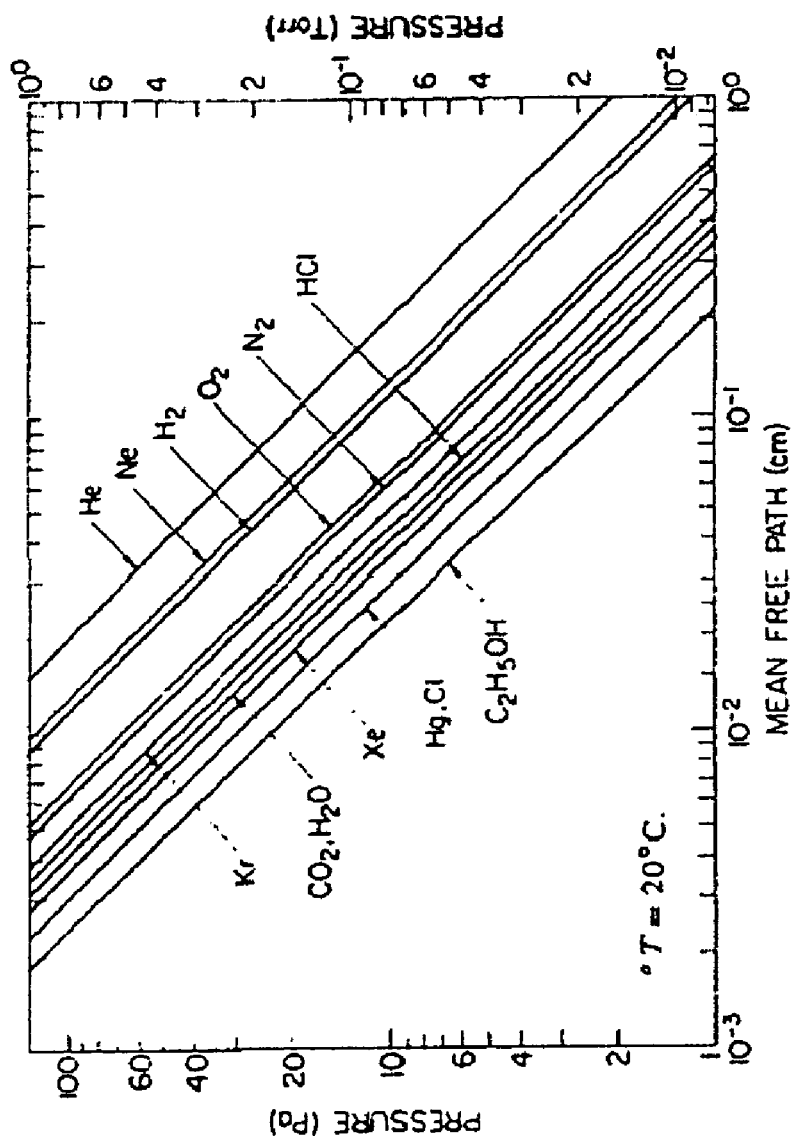
FIG. 1 is a drawing showing relationships between pressure and mean free path of different reaction gases.

FIG. 1 is a drawing showing relationships between pressure and mean free path for different reaction gases.

Referring to FIG. 1, the drawing shows linear relationships between the pressure and the mean free path of different reaction gases. The relationships can be shown by the equation (1) as follows:

$$L = \frac{1}{\sqrt{2}\,(\pi\delta^2)} = \frac{0.707}{\delta n} \approx 2.331 \times 10^{-20} \frac{T}{P\delta^2} \qquad (1)$$

wherein L represents mean free path; $\delta$ represents the molecular diameter of the background gas atoms; n represents number density (atoms/cm$^3$) of the background gas; T represents temperature; and P represents pressure.

From equation (1), the higher the pressure, the shorter the mean free path of atoms. Atoms sputtered by Physical Vapor deposition (PVD) with a reaction gas such as nitrogen or argon are disposed on the via or contact hole structure. With kinetic energy, the atoms move along the via or contact hole profile. The atoms on the sidewalls of the via or contact hole profile tend to move out from the sidewall areas. Under a low pressure, the mean free path of atoms increases and the moving of the atoms out of the sidewalls of the via or contact hole becomes more serious. The moving of the atoms results in a non-conformal barrier layer over the via or contact hole profile. This phenomenon, however, can be suppressed by increasing the working pressure.

FIGS. 2A and 2B are schematic cross sectional drawings showing exemplary barrier layers depositing in a via hole and in a via hole/trench structure, respectively.

Referring to FIG. 2A, a metal layer 210a is formed on a substrate 200a. A dielectric layer 220a is formed over the substrate, covering the metal layer 210a. A via hole 240a is formed within the dielectric layer 220a, exposing a portion of a surface of the metal layer 210a.

The substrate 200a can be, for example, a silicon substrate, a III–V compound substrate, a glass substrate, or any other substrate similar thereto. The metal layer 210a can be, for example, aluminum, aluminum copper or copper. The metal layer 210a can be formed by, for example, chemical vapor deposition (CVD), physical vapor deposition (PVD), electroplating or electroless plating or a combination thereof. The material of the dielectric layer 220a includes, for example, undoped silicate glass (USG), boron doped silicate glass (BSG), phosphorous doped silicate glass (PSG), boron phosphorous doped silicate glass (BPSG), polyimides, benzocyclobutene, parylenes, diamond-like carbon, poly(arylene ethers), cyclotenes, fluorocarbons, methyl silsesquioxane, hydrogen silsesquioxanes, nanoporous oxides or carbon doped silicon dioxides. The dielectric layer 220a can be formed by, for example, CVD, PVD, or spin coating. The via hole 240a can be formed by a photolithographic process and an etch process.

Referring to FIG. 2B, a metal layer 210b is formed on a substrate 200b. A dielectric layer 220b is formed over the substrate, covering the metal layer 210b. A via hole/trench 240b is formed within the dielectric layer 220b, exposing a portion of a surface of the metal layer 210b.

The substrate 200b, the metal layer 210b and the dielectric layer 220b of FIG. 2B are similar to the substrate 200a, the metal layer 210a and the dielectric layer 220a of FIG. 2A, respectively. Detailed descriptions are not repeated. The via hole/trench 240b can be formed by, for example, a via-first or a trench-first dual damascene process. The method of forming the via hole/trench 240b comprises photolithographic and etch processes. The method of forming either the via-first dual damascene or a trench-first dual damascene is known in the semiconductor industry.

Barrier layers 230a and 230b are formed in the via hole 240a and the via hole/trench 240b, respectively. The barrier layers 230a and 230b are substantially conformal over the via hole 240a and the via hole/trench 240b, respectively. The barrier layers 230a and 230b are formed under a high working pressure. For example, the working pressure may be from about 0.5 mTorr to about 200 mTorr. The barrier layers 230a and 230b can be a compound made from barrier material selected from a group consisting Ta, W, Ti, Ru, Zr, Hf, V, Nb, Cr and Mo and at least one reaction gas containing at least one component of oxygen, nitrogen or carbon. The reaction gas can be, for example, nitrogen. Accordingly, the barrier layers 230a and 230b can be, for example, TaN, TaO, TaON, WN, TiN or any compound thereof. For the barrier layers 230a and 230b, a ratio of the component to the barrier material is not less than about 0.45.

A flow rate of the reaction gas is from about 5 standard cubic centimeters per minute (sccm) to about 200 sccm. In addition, a target direct current (DC) power is from about 10,000 Watts to about 90,000 Watts; a wafer bias power is from about 100 Watts to about 1,500 Watts.

In this embodiment, the barrier layers 230a and 230b are a TaN layer. The barrier layers 230a and 230b have a N/Ta ratio from about 0.45 to about 1.00. The flow rate of the reaction gas containing the nitrogen component, such as $N_2$, is from about 0.5 mTorr to about 200 mTorr. A flow rate of argon (Ar) is from about 5 sccm to about 200 sccm. A target DC power is from about 10,000 Watts to about 90,000 Watts, and a wafer bias power is from about 100 Watts to about 1,500 Watts. A wafer temperature is from about 25° C. to about 200° C.

Due to the high working pressure deposition, the barrier layers 230a and 230b can be substantially conformal over the via hole 240a and the via hole/trench 240b, respectively.

The crystal properties of the barrier layers 230a and 230b can be identified by a technique that generates a diffraction pattern. The technique includes, for example, X-ray diffraction or narrow beam diffraction.

FIGS. 3A–3B and 3C–3D are Transmission Electronic Microscope (TEM) pictures and diffraction patterns of barrier layers formed by a prior art method and an exemplary method, respectively.

Figure 3A:
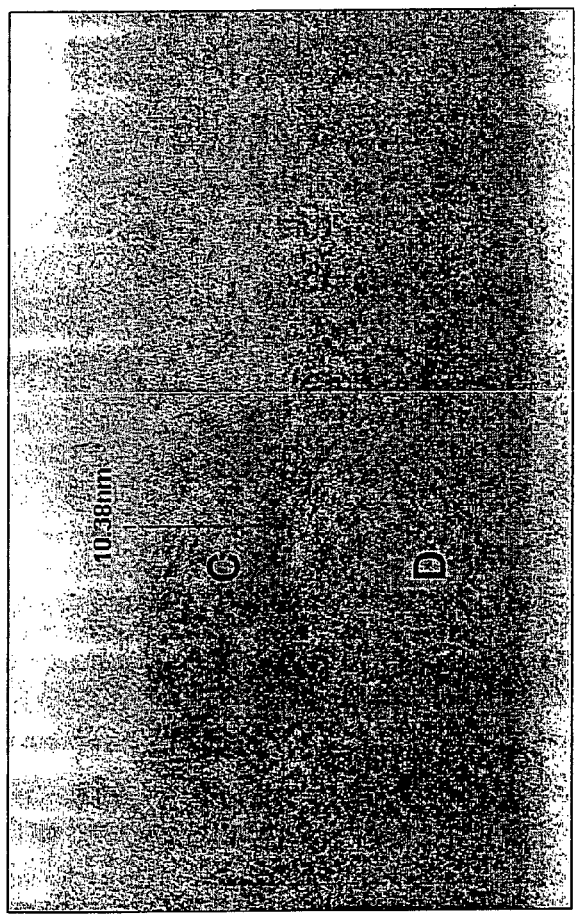
FIGS. 3A–3B and 3C–3D are Transmission Electronic Microscope (TEM) pictures and diffraction patterns of barrier layers formed by a prior art method and an exemplary method, respectively.
Figure 3B:
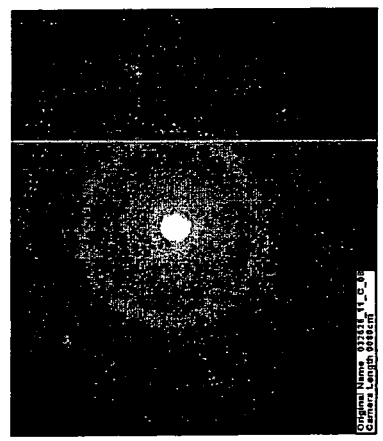

Referring to FIG. 3A, the C area shown in the TEM picture represents a Ta layer; the D area represents a TaN layer which is formed by a prior art low-pressure method. The diffraction pattern at the D area is shown in FIG. 3B. Referring to FIG. 3B, the narrow beam diffraction pattern shows fuzzy rings and dimming spots around the center of the diffraction pattern. These fuzzy rings and dimming spots show the existence of nano-crystalline in the TaN layer.

Figure 3C:
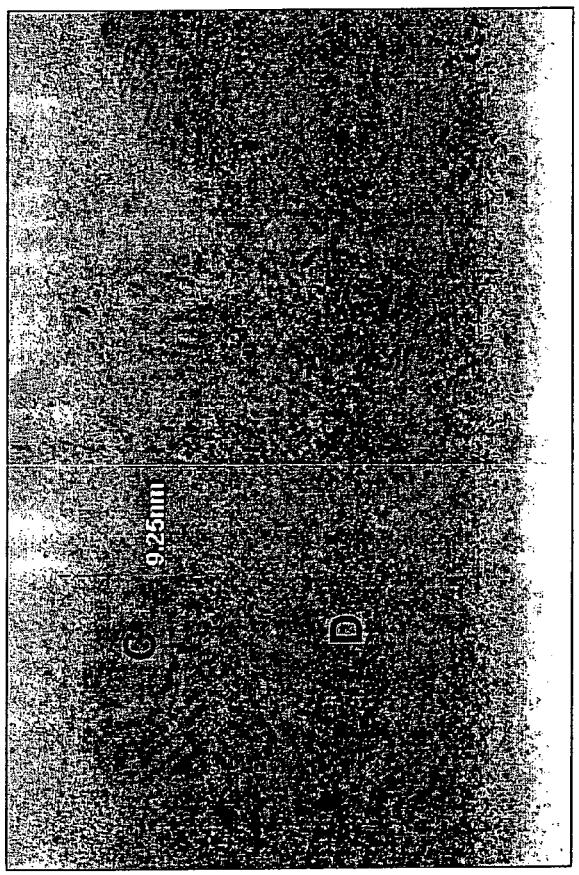
Figure 3D:
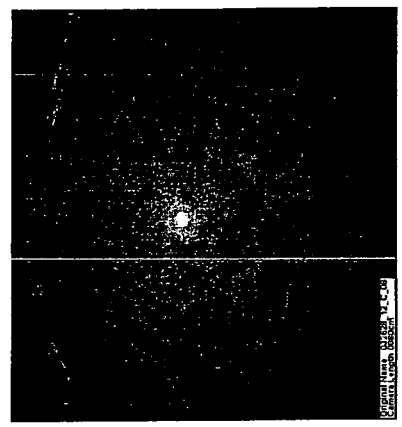

Referring to FIG. 3C, the C area shown in the TEM picture represents a Ta layer; the D area represents a TaN layer which is formed by the method of this embodiment. The diffraction pattern at the D area is shown in FIG. 3D. Referring to FIG. 3D, the narrow beam diffraction pattern shows no diffraction ring and diffraction spot. On the basis of the narrow beam diffraction pattern, the barrier layer comprises more α-Ta (B.C.C. structure). With more α-Ta phase, the structure of the barrier layer tends to be amorphous (nano-crystalline) within the TaN layer. Accordingly, the TaN layer formed by this exemplary method substantially does not comprise a long-term order crystalline microstructure.

Under a high working pressure, the barrier layer formed by the exemplary methods is substantially conformal over the via or contact hole. Accordingly, the subsequent metal deposition process completely fills the metal layer in the via or contact hole without forming pin hole therein.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for forming a barrier layer, comprising:
    applying a working pressure from about 0.5 mTorr to about 200 mTorr;
    applying a target DC power from about 10,000 Watts to about 90,000 Watts;
    applying a wafer bias power from about 100 Watts to about 1,500 Watts; and
    forming the barrier layer without substantially forming crystalline material therein.

2. The method for forming a barrier layer of claim 1, wherein a ratio of the component of the reaction gas to the barrier material is not less than about 0.45.

3. The method for forming a barrier layer of claim 1, wherein the barrier layer is substantially conformally formed in a via or contact hole.

4. The method for forming a barrier layer of claim 1, wherein the barrier layer is a compound made from barrier material selected from the group consisting of Ta, W, Ti, Ru, Zr, Hf, V, Nb, Cr and Mo and at least one reaction gas containing at least one component of oxygen, nitrogen or carbon.

5. The method for forming a barrier layer of claim 4, wherein a flow rate of the reaction gas is from about 0.5 standard cubic centimeters per minute (sccm) to about 200 sccm.

6. The method for forming a barrier layer of claim 5, wherein the reaction gas is nitrogen.

7. The method for forming a barrier layer of claim 6, further comprising an argon gas with a flow rate from about 0.5 sccm to about 200 sccm.

8. A barrier layer formed by the method of claim 1.

9. The barrier layer of claim 8, wherein the barrier layer comprises at least one barrier material of Ta, W, Ti, Ru, Zr, Hf, V, Nb, Cr or Mo and at least one component of oxygen, nitrogen or carbon, a ratio of the component to the barrier material not less than about 0.45.

10. The barrier layer of claim 9, wherein the barrier layer substantially does not comprise a long-term order crystalline microstructure.

11. The barrier layer of claim 10, wherein the crystalline material is adapted to be identified by a technique that generates a diffraction pattern.

12. The barrier layer of claim 11, wherein the technique includes X-ray diffraction or narrow beam diffraction.

13. A method for forming a barrier layer, comprising:
applying a working pressure from about 0.5 mTorr to about 200 mTorr; and
forming the barrier layer without substantially forming crystalline material therein,
wherein the component is nitrogen and the barrier material is Ta, and an N/Ta ratio is from about 0.45 to about 1.00.

14. The method for forming a barrier layer of claim 8, wherein a target DC power is from about 10,000 Watts to about 90,000 Watts, and a wafer bias power is from about 100 Watts to about 1,500 Watts.

15. The method for forming a barrier layer of claim 13, wherein a flow rate of the reaction gas containing the nitrogen component is from about 5 sccm to about 200 sccm.

16. The method for forming a barrier layer of claim 15, wherein the reaction gas is nitrogen.

17. The method for forming a barrier layer of claim 16, further comprising an argon gas with a flow rate from about 5 sccm to about 200 sccm.

18. A barrier layer formed by the method of claim 13.

19. The barrier layer of claim 18, wherein the barrier layer substantially does not comprise a β-Ta phase.

20. The barrier layer of claim 18, wherein the barrier layer comprises an α-Ta phase.

21. The barrier layer of claim 18, wherein the crystalline material is adapted to be identified by a technique that generates a diffraction pattern.

22. The barrier layer of claim 21, wherein the technique includes X-ray diffraction or narrow beam diffraction.

23. A method for forming a barrier layer, comprising a working pressure for forming the barrier layer from about 0.5 mTorr to about 200 mTorr; the barrier layer comprising a compound made from barrier material selected from the group consisting of Ta, W, Ti, Ru, Zr, Hf, V, Nb, Cr arid Mo and at least one reaction gas containing at least one component of oxygen, nitrogen or carbon; a flow rate of the reaction gas from about 5 standard cubic centimeters per minute (sccm) to about 200 sccm; an argon gas with a flow rate from about 5 sccm to about 200 sccm; a target DC power from about 10,000 Watts to about 90,000 Watts; and a wafer bias power from about 100 Watts to about 1,500 Watts.

* * * * *

UNITED STATES PATENT AND TRADEMARK OFFICE
CERTIFICATE OF CORRECTION

PATENT NO. : 7,179,759 B2  Page 1 of 1
APPLICATION NO. : 10/955519
DATED : February 20, 2007
INVENTOR(S) : Cheng-Lin Huang, Ching-Hua Hsien and Shau-Lin Shue It is certified that error appears in the above-identified patent and that said Letters Patent is hereby corrected as shown below:

Column 6, line 20, delete "arid" and insert therefore -- and --.

Signed and Sealed this

Fourteenth Day of August, 2007

JON W. DUDAS
*Director of the United States Patent and Trademark Office*